(12) United States Patent
Yu et al.

(10) Patent No.: US 9,653,828 B1
(45) Date of Patent: May 16, 2017

(54) ELECTRICAL CONNECTOR

(71) Applicant: Cheng Uei Precision Industry Co., Ltd., New Taipei (TW)

(72) Inventors: Xi Yu, Dong-Guan (CN); Bo Liu, Dong-Guan (CN)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/340,970

(22) Filed: Nov. 1, 2016

(51) Int. Cl.
*H01R 12/00* (2006.01)
*H01R 12/71* (2011.01)
*H01R 13/405* (2006.01)
*H01R 13/516* (2006.01)
*H01R 12/50* (2011.01)

(52) U.S. Cl.
CPC ......... *H01R 12/712* (2013.01); *H01R 13/405* (2013.01); *H01R 13/516* (2013.01); *H01R 23/70* (2013.01)

(58) Field of Classification Search
USPC .................................................. 439/59, 951
See application file for complete search history.

(56) References Cited

U.S. PATENT DOCUMENTS 7,887,337 B1 * 2/2011 Yuan .................. H01R 13/6485
  439/76.1
8,052,473 B2 * 11/2011 Chiang .................... H01R 9/03
  439/607.41

\* cited by examiner

*Primary Examiner* — Tho D Ta
(74) *Attorney, Agent, or Firm* — Cheng-Ju Chiang

(57) ABSTRACT

An electrical connector mounted to a circuit board, includes an insulating housing, a plurality of terminals integrally molded to the insulating housing, a shell surrounding the insulating housing, and an upper cover covered on the circuit board. The shell has at least one lower fastening piece. At least one tongue board of the circuit board is fastened on the at least one lower fastening piece. Circuit lines equipped on a bottom surface of the at least one tongue board are embedded in lower embedding slots of the at least one lower fastening piece. The upper cover has at least one upper fastening piece. The at least one upper fastening piece is fastened on the at least one tongue board. Circuit lines equipped on a top surface of the at least one tongue board are embedded in upper embedding slots of the at least one upper fastening piece.

14 Claims, 7 Drawing Sheets

ELECTRICAL CONNECTOR

BACKGROUND OF THE INVENTION

1. Field of the Invention

The present invention generally relates to a connector, and more particularly to an electrical connector mounted to a circuit board.

2. The Related Art

A conventional electrical connector is mounted to a circuit board. At least one portion of a front of the circuit board protrudes frontward to form at least one tongue board. The conventional electrical connector generally includes an insulating housing, a plurality of terminals, a shell and an upper cover. The terminals are integrally molded to the insulating housing with top ends thereof projecting beyond a top surface of the insulating housing and bottom ends thereof projecting beyond a bottom surface of the insulating housing. The shell encloses the insulating housing. The circuit board is mounted to tops of the insulating housing, the shell and the terminals. The upper cover is covered on the circuit board.

However, the circuit board of the conventional electrical connector is clamped between the shell together with the insulating housing and the upper cover, the at least one tongue board projects beyond fronts of the shell, the insulating housing and the upper cover that makes fracturing and loosening phenomena of the at least one tongue board occurring when the at least one tongue board of the conventional electrical connector is connected with a docking connector. As a result, the conventional electrical connector is failed in connecting with the docking connector.

Thus, whether the above-mentioned problem is solved by virtue of designing an innovative electrical connector has become an important issue which is to be solved by skilled persons in the art, so the innovative electrical connector having larger improvements in structure and function is essential to be provided to effectively improve the above-mentioned problem.

SUMMARY OF THE INVENTION

An object of the present invention is to provide an electrical connector mounted to a circuit board. The circuit board has a base board, and at least one tongue board protruded frontward from at least one portion of a front edge of the base board. A top surface and a bottom surface of the at least one tongue board are equipped with a plurality of circuit lines. The electrical connector includes an insulating housing, a plurality of terminals integrally molded to the insulating housing, a shell surrounding the insulating housing, and an upper cover covered on the circuit board. Top ends and bottom ends of the terminals project beyond a top surface and a bottom surface of the insulating housing, respectively. The shell has a base frame, and at least one lower fastening piece extended frontward from a top edge of a front end of the base frame. The at least one lower fastening piece opens a plurality of lower embedding slots. The circuit board is mounted on the insulating housing and the shell. The terminals are soldered to the circuit board. The at least one tongue board of the circuit board is fastened on the at least one lower fastening piece. The circuit lines equipped on the bottom surface of the at least one tongue board are embedded in the lower embedding slots of the at least one lower fastening piece. The upper cover has a base portion, and at least one upper fastening piece extended from a front of the base portion. The at least one upper fastening piece is corresponding to the at least one lower fastening piece. A bottom surface of the at least one upper fastening piece opens a plurality of upper embedding slots. The at least one upper fastening piece is fastened on the at least one tongue board. The circuit lines equipped on the top surface of the at least one tongue board are embedded in the upper embedding slots of the at least one upper fastening piece.

As described above, the circuit board is clamped between the shell and the upper cover, the circuit lines equipped on the bottom surface of the at least one tongue board are embedded in the lower embedding slots of the at least one lower fastening piece, and the circuit lines equipped on the top surface of the at least one tongue board of the circuit board are embedded in the upper embedding slots of the at least one upper fastening piece, so that the circuit board fits between the shell and the upper cover tightly, and the electrical connector is matched with a docking connector tightly to have a larger contact area. As a result, the electrical connector has larger improvements in structure and function.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
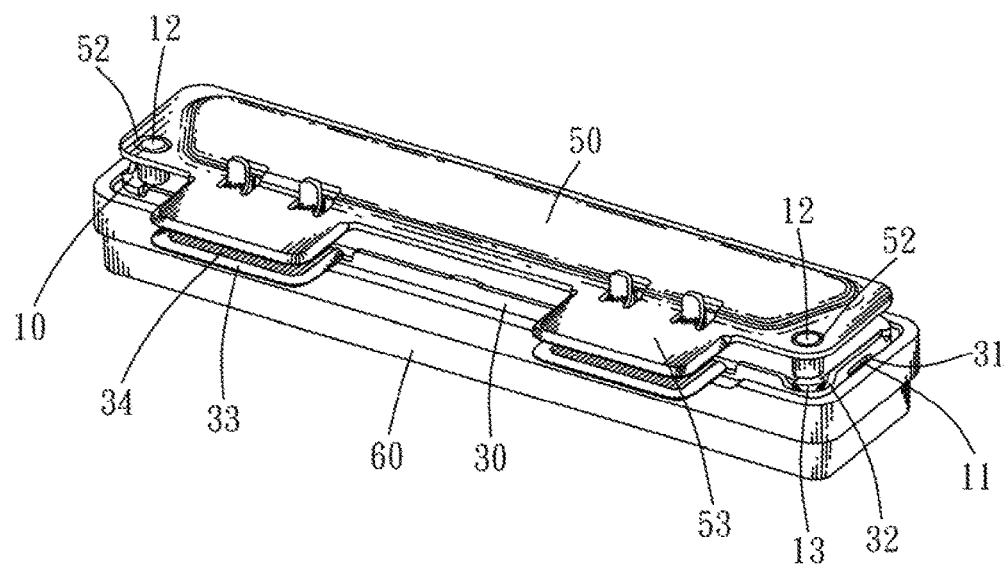
FIG. 1 is a perspective view of an electrical connector in accordance with a preferred embodiment of the present invention.

With reference to FIG. 1 to FIG. 6, an electrical connector 100 in accordance with a preferred embodiment of the present invention is shown. The electrical connector 100 mounted to a circuit board 200, includes an insulating housing 10, a plurality of terminals 20, a shell 30, an insulation layer 40, an upper cover 50 and a protecting cover 60.

Figure 2:
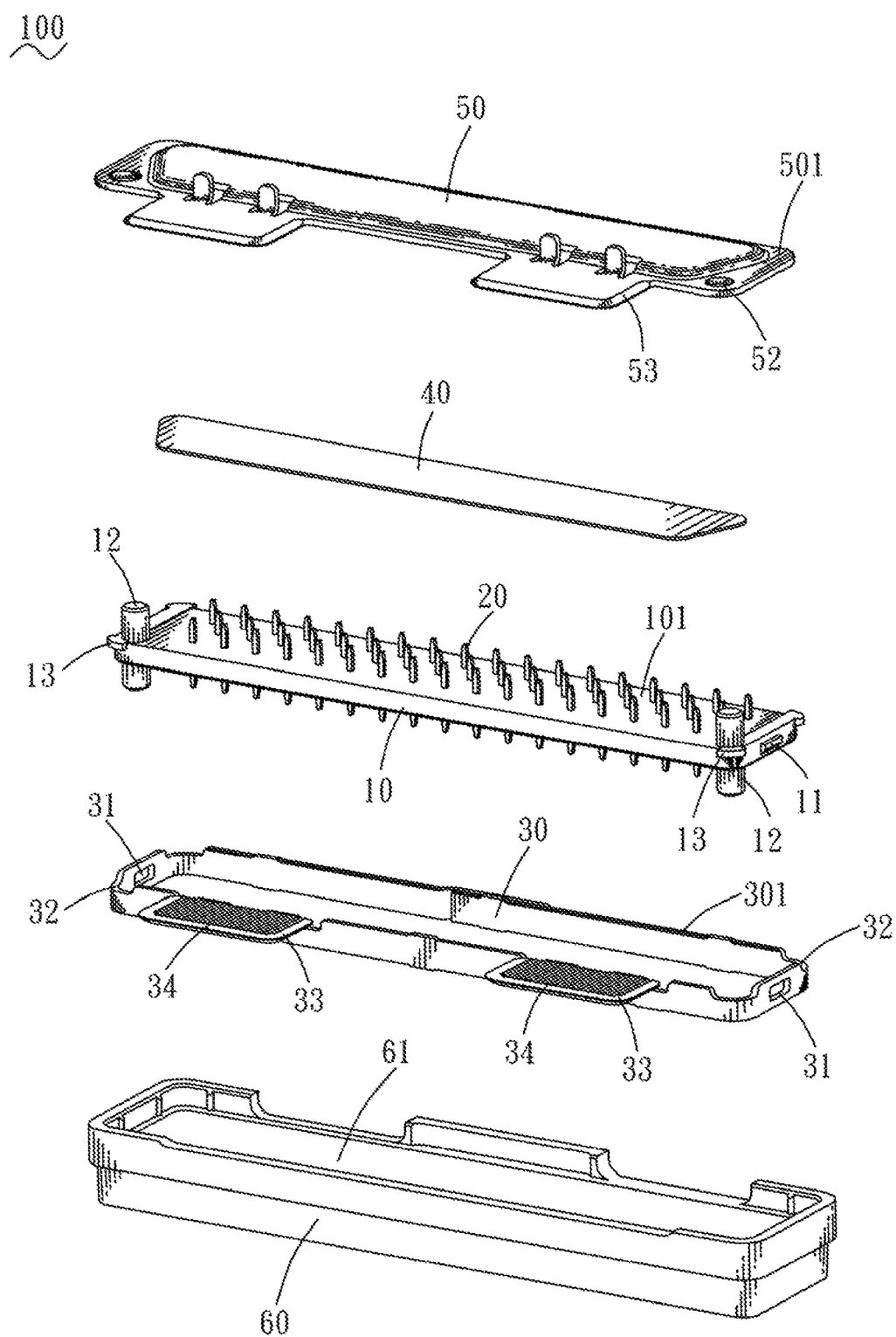
FIG. 2 is an exploded view of the electrical connector of FIG. 1.

Referring to FIG. 2, the insulating housing 10 is an integrative element. The insulating housing 10 has a base body 101. Two opposite sides of the base body 101 protrude outward to form two buckling blocks 11. Several portions of a top surface and a bottom surface of the base body 101 protrude outward to form a plurality of fastening pillars 12. Several portions of a top of a periphery of the base body 101 protrude outward to form a plurality of blocking blocks 13 projecting beyond a peripheral surface of the base body 101.

Referring to FIG. 2, the terminals 20 are integrally molded to the insulating housing 10. Top ends and bottom ends of the terminals 20 project beyond a top surface and a bottom surface of the insulating housing 10, respectively. The terminals 20 are arranged in a few rows. In this embodiment of the present invention, the terminals 20 are arranged in three rows.

Figure 3:
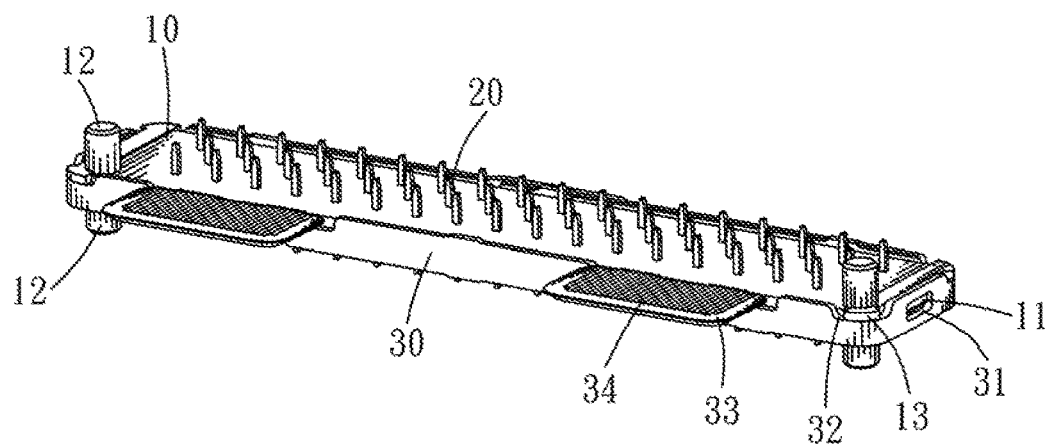
FIG. 3 is a partially perspective view showing an insulating housing, a plurality of terminals and a shell of the electrical connector of FIG. 2.
Figure 4:
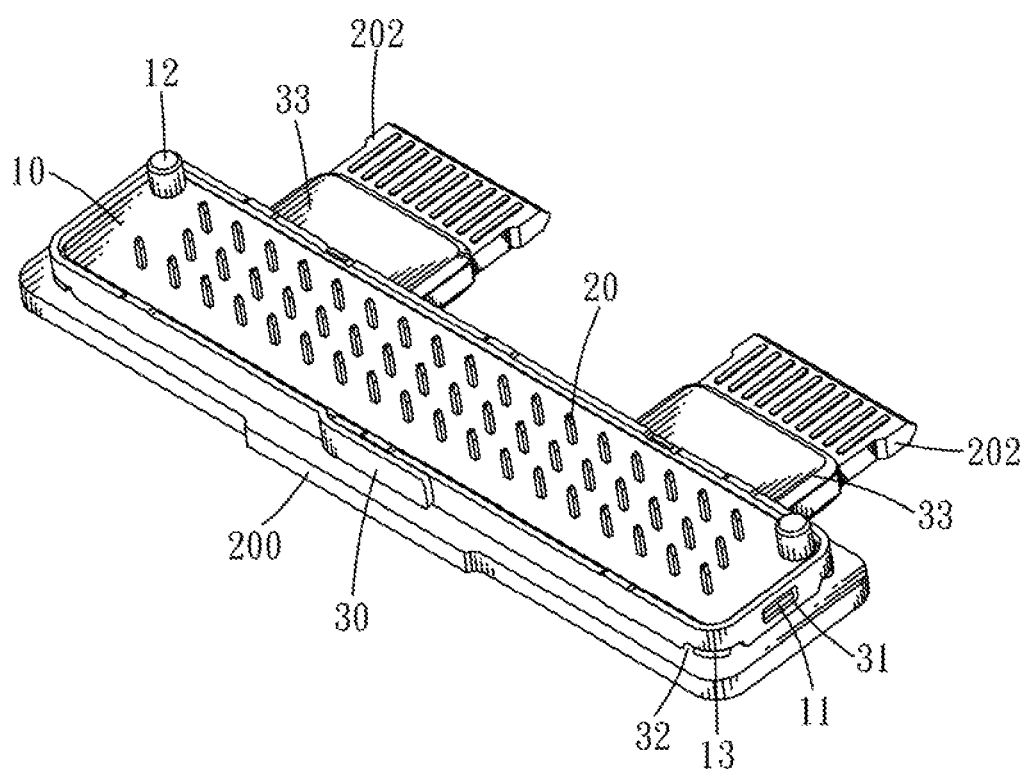
FIG. 4 is another partially perspective view showing that the circuit board is mounted to the insulating housing, the shell and the terminals of the electrical connector of FIG. 2.
Figure 5:
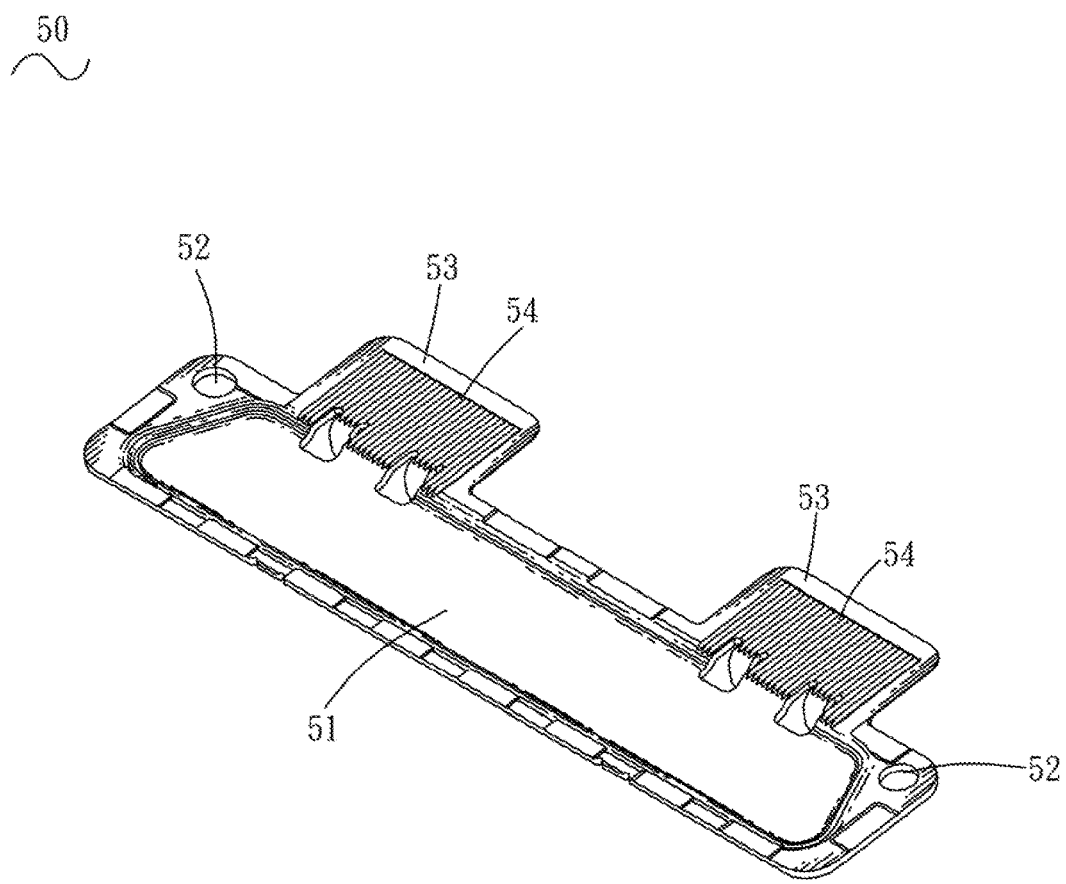
FIG. 5 is a perspective view of an upper cover of the electrical connector of FIG. 2.

Referring to FIG. 2 and FIG. 3, the shell 30 surrounds the insulating housing 10. The shell 30 has a base frame 301, and at least one lower fastening piece 33 extended frontward from a top edge of a front end of the base frame 301. The at least one lower fastening piece 33 opens a plurality of lower embedding slots 34. In this embodiment, the shell 30 has two lower fastening pieces 33 are extended frontward from two opposite sides of the top edge of the front end of the base frame 301. Each of the two lower fastening pieces 33 opens a plurality of the lower embedding slots 34. Two opposite sides of the base frame 301 opens two buckling grooves 31 corresponding to the two buckling blocks 11, respectively. A top periphery of the base frame 301 opens a plurality of blocking grooves 32 corresponding to the respective blocking blocks 13.

Specifically, the two buckling blocks 11 are buckled in the two buckling grooves 31, respectively. The blocking blocks 13 are blocked in the respective blocking grooves 32. The fastening pillars 12 of the insulating housing 10 protruded from the top surface of the base body 101 project upward out of the shell 30. The fastening pillars 12 of the insulating housing 10 protruded from the bottom surface of the base body 101 project downward out of the shell 30. The at least one lower fastening piece 33 projects frontward beyond the insulating housing 10. In this embodiment, the two lower fastening pieces 33 project frontward beyond the insulating housing 10.

Referring to FIG. 2 to FIG. 7, the circuit board 200 is clamped between the shell 30 and the upper cover 50. The circuit board 200 has a base board 205, and at least one tongue board 202 protruded frontward from at least one portion of a front edge of the base board 205. A top surface and a bottom surface of the at least one tongue board 202 are equipped with a plurality of circuit lines 204. In this embodiment, the circuit board 200 has two tongue boards 202 protruded frontward from two portions of the front edge of the base board 205. The top surfaces and the bottom surfaces of the two tongue boards 202 are equipped with a plurality of the circuit lines 204. The circuit board 200 opens a plurality of assembling holes 201. The circuit board 200 opens a plurality of perforations 203 corresponding to the fastening pillars 12 protruded from the top surface of the base body 101. The circuit board 200 is mounted to the insulating housing 10, the shell 30 and the terminals 20 of the electrical connector 100.

The circuit board 200 is mounted on the insulating housing 10 and the shell 30. The top ends of the terminals 20 pass through the assembling holes 201 of the circuit board 200. The top ends of the terminals 20 project beyond and are soldered to a top surface of the circuit board 200. The fastening pillars 12 protruded from the top surface of the base body 101 are inserted into the perforations 203, and top ends of the fastening pillars 12 protruded from the top surface of the base body 101 project out of the perforations 203.

The at least one tongue board 202 of the circuit board 200 is fastened on the at least one lower fastening piece 33 of the shell 30. The at least one tongue board 202 projects beyond a front surface of the at least one lower fastening piece 33. The circuit lines 204 equipped on the bottom surface of the at least one tongue board 202 is embedded in the lower embedding slots 34 of the at least one lower fastening piece 33. In this embodiment, the two tongue boards 202 of the circuit board 200 are fastened on the two lower fastening pieces 33 of the shell 30, respectively. The two tongue boards 202 project beyond the front surfaces of the two lower fastening pieces 33, respectively. The circuit lines 204 equipped on the bottom surfaces of the two tongue boards 202 are embedded in the lower embedding slots 34 of the two lower fastening pieces 33, respectively.

Figure 6:
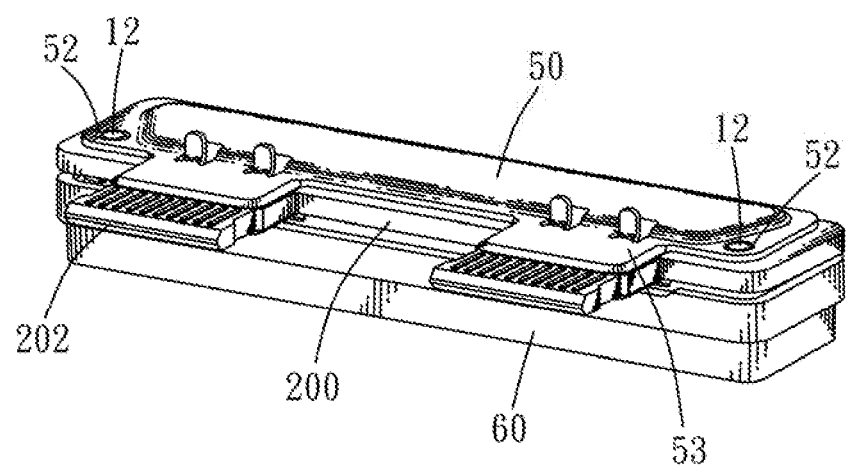
FIG. 6 is a perspective view of the electrical connector of FIG. 1, wherein the electrical connector is mounted to a circuit board.
Figure 7:
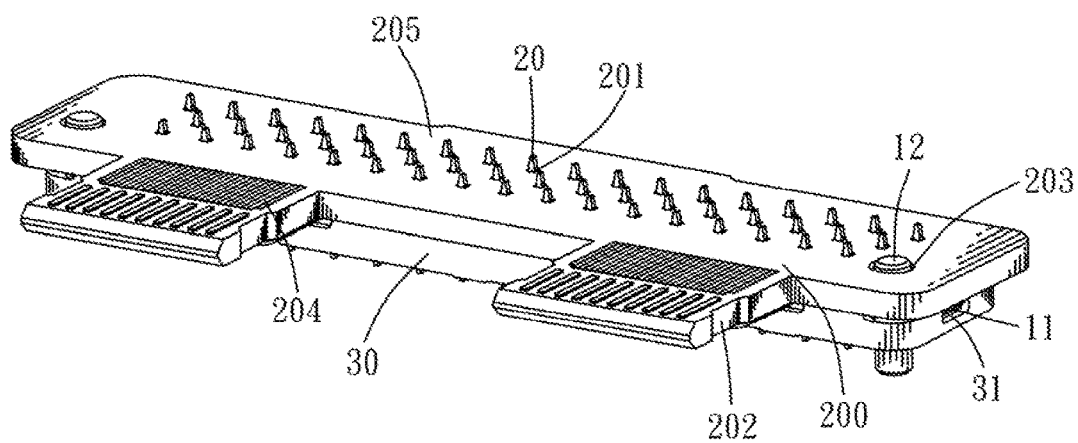
FIG. 7 is a partially perspective view showing that the circuit board is mounted to the insulating housing, the shell and the terminals of the electrical connector of FIG. 6.

Referring to FIG. 2, FIG. 6 and FIG. 7, the insulation layer 40 is adhered to a bottom of the upper cover 50. The insulation layer 40 is located above the circuit board 200 and covers the terminals 20.

Referring to FIG. 2, FIG. 5, FIG. 6 and FIG. 7, the upper cover 50 is covered on the circuit board 200. The upper cover 50 has a base portion 501, and at least one upper fastening piece 53 extended from a front of the base portion 501. The at least one upper fastening piece 53 is corresponding to the at least one lower fastening piece 33. A bottom surface of the at least one upper fastening piece 53 opens a plurality of upper embedding slots 54. In this embodiment, the upper cover 50 has two upper fastening pieces 53 extended from two opposite sides of the front of the base portion 501. The two upper fastening pieces 53 are corresponding to the two lower fastening pieces 33, respectively. Bottom surfaces of the two upper fastening pieces 53 open a plurality of the upper embedding slots 54. A middle of a bottom surface of the base portion 501 of the upper cover 50 is recessed inward to form a receiving space 51. The base portion 501 of the upper cover 50 opens a plurality of fastening holes 52 corresponding to the fastening pillars 12 protruded from the top surface of the base body 101.

The insulation layer 40 and the top ends of the terminals 20 are received in the receiving space 51. The top ends of the fastening pillars 12 protruded from the top surface of the base body 101 are inserted into the fastening holes 52. The at least one upper fastening piece 53 is fastened on the at least one tongue board 202. The at least one tongue board 202 projects beyond a front surface of the at least one upper fastening piece 53. The circuit lines 204 equipped on the top surface of the at least one tongue board 202 of the circuit board 200 is embedded in the upper embedding slots 54 of the at least one upper fastening piece 53. In this embodiment, the two upper fastening pieces 53 are fastened on the two tongue boards 202, respectively. The two tongue boards 202 project beyond front surfaces of the two upper fastening pieces 53. The circuit lines 204 equipped on the top surfaces of the two tongue boards 202 of the circuit board 200 are embedded in the upper embedding slots 54 of the two upper fastening pieces 53, respectively.

Referring to FIG. 1, FIG. 2 and FIG. 3, the protecting cover 60 has an accommodating space 61. The protecting cover 60 is assembled under the shell 30. The fastening pillars 12 protruded from the bottom surface of the base body 101 and the bottom ends of the terminals 20 projecting beyond the bottom surface of the insulating housing 10 are received in the accommodating space 61.

As described above, the circuit board 200 is clamped between the shell 30 and the upper cover 50, the circuit lines 204 equipped on the bottom surface of the at least one tongue board 202 are embedded in the lower embedding slots 34 of the at least one lower fastening piece 33, and the circuit lines 204 equipped on the top surface of the at least one tongue board 202 of the circuit board 200 are embedded in the upper embedding slots 54 of the at least one upper fastening piece 53, so that the circuit board 200 fits between the shell 30 and the upper cover 50 tightly, and the electrical connector 100 is matched with a docking connector (not shown) tightly to have a larger contact area. As a result, the electrical connector 100 has larger improvements in structure and function.

What is claimed is:

1. An electrical connector mounted to a circuit board, the circuit board having a base board, and at least one tongue board protruded frontward from at least one portion of a front edge of the base board, a top surface and a bottom surface of the at least one tongue board being equipped with a plurality of circuit lines, the electrical connector comprising:

an insulating housing;
a plurality of terminals integrally molded to the insulating housing, top ends and bottom ends of the terminals projecting beyond a top surface and a bottom surface of the insulating housing, respectively;
a shell surrounding the insulating housing, the shell having a base frame, and at least one lower fastening piece extended frontward from a top edge of a front end of the base frame, the at least one lower fastening piece opening a plurality of lower embedding slots, the circuit board being mounted on the insulating housing and the shell, the terminals being soldered to the circuit board, the at least one tongue board of the circuit board being fastened on the at least one lower fastening piece, the circuit lines equipped on the bottom surface of the at least one tongue board being embedded in the lower embedding slots of the at least one lower fastening piece; and
an upper cover covered on the circuit board, the upper cover having a base portion, and at least one upper fastening piece extended from a front of the base portion, the at least one upper fastening piece being corresponding to the at least one lower fastening piece, a bottom surface of the at least one upper fastening piece opening a plurality of upper embedding slots, the at least one upper fastening piece being fastened on the at least one tongue board, the circuit lines equipped on the top surface of the at least one tongue board being embedded in the upper embedding slots of the at least one upper fastening piece.

2. The electrical connector as claimed in claim 1, wherein the insulating housing has a base body, two opposite sides of the base body protrude outward to form two buckling blocks, two opposite sides of the base frame opens two buckling grooves, the two buckling blocks are buckled in the two buckling grooves, respectively.

3. The electrical connector as claimed in claim 1, wherein the insulating housing has a base body, several portions of a top of a periphery of the base body protrude outward to form a plurality of blocking blocks, a top periphery of the base frame opens a plurality of blocking grooves, the blocking blocks are blocked in the respective blocking grooves.

4. The electrical connector as claimed in claim 1, wherein the insulating housing has a base body, several portions of a top surface and a bottom surface of the base body protrude outward to form a plurality of fastening pillars projecting out of the shell.

5. The electrical connector as claimed in claim 4, wherein the circuit board opens a plurality of perforations, the fastening pillars protruded from the top surface of the base body are inserted into the perforations, and top ends of the fastening pillars protruded from the top surface of the base body project out of the perforations.

6. The electrical connector as claimed in claim 5, wherein the base portion of the upper cover opens a plurality of fastening holes, the top ends of the fastening pillars protruded from the top surface of the base body are inserted into the fastening holes.

7. The electrical connector as claimed in claim 1, wherein the top ends of the terminals project beyond and are soldered to a top surface of the circuit board, a middle of a bottom surface of the base portion of the upper cover is recessed inward to form a receiving space, the top ends of the terminals are received in the receiving space.

8. The electrical connector as claimed in claim 7, further comprising an insulation layer adhered to a bottom of the upper cover, the insulation layer being located above the circuit board and covering the terminals, the insulation layer being received in the receiving space.

9. The electrical connector as claimed in claim 1, wherein the circuit board opens a plurality of assembling holes, the top ends of the terminals pass through the assembling holes of the circuit board.

10. The electrical connector as claimed in claim 1, further comprising a protecting cover assembled under the shell, the protecting cover having an accommodating space, the bottom ends of the terminals projecting beyond the bottom surface of the insulating housing being received in the accommodating space.

11. The electrical connector as claimed in claim 1, wherein two portions of the front edge of the base board protrude frontward to form two tongue boards, the top surfaces and the bottom surfaces of the two tongue boards are equipped with a plurality of circuit lines, the shell has two lower fastening pieces extended frontward from two opposite sides of the top edge of the front end of the base frame, each of the two lower fastening pieces opens a plurality of the lower embedding slots, the two tongue boards are fastened on the two lower fastening pieces, respectively, the circuit lines equipped on the bottom surfaces of the two tongue boards are embedded in the lower embedding slots of the two lower fastening pieces, respectively.

12. The electrical connector as claimed in claim 11, wherein the upper cover has two upper fastening pieces extended frontward from two opposite sides of the front of the base portion, the two upper fastening pieces are corresponding to the two lower fastening pieces, respectively, the bottom surfaces of the two upper fastening pieces open a plurality of upper embedding slots, the two upper fastening pieces are fastened on the two tongue boards, respectively, the circuit lines equipped on the top surfaces of the two tongue boards are embedded in the upper embedding slots of the two upper fastening pieces, respectively.

13. The electrical connector as claimed in claim 1, wherein the terminals are arranged in a few rows.

14. The electrical connector as claimed in claim 1, wherein the terminals are arranged in three rows.

* * * * *